(12) United States Patent
McMenemy et al.

(10) Patent No.: US 11,293,981 B2
(45) Date of Patent: Apr. 5, 2022

(54) SYSTEMS AND METHODS FOR FALSE-POSITIVE REDUCTION IN POWER ELECTRONIC DEVICE EVALUATION

(71) Applicants: TOYOTA MOTOR ENGINEERING & MANUFACTURING NORTH AMERICA, INC., Plano, TX (US); UNIVERSITY OF CONNECTICUT, Farmington, CT (US)

(72) Inventors: Donald McMenemy, Willington, CT (US); John Kaminski, Vernon, CT (US); Shailesh N. Joshi, Ann Arbor, MI (US); Ali M. Bazzi, South Windsor, CT (US); Krishna Pattipati, Storrs Mansfield, CT (US)

(73) Assignees: Toyota Motor Engineering & Manufacturing North America, Inc., Plano, TX (US); University of Connecticut, Farmington, CT (US)

( * ) Notice: Subject to any disclaimer, the term of this patent is extended or adjusted under 35 U.S.C. 154(b) by 101 days.

(21) Appl. No.: 16/743,541

(22) Filed: Jan. 15, 2020

(65) Prior Publication Data
US 2021/0215760 A1     Jul. 15, 2021

(51) Int. Cl.
G01R 31/3183    (2006.01)
G01R 31/52      (2020.01)
G06N 3/02       (2006.01)

(52) U.S. Cl.
CPC ..... G01R 31/318342 (2013.01); G01R 31/52 (2020.01); G06N 3/02 (2013.01)

(58) Field of Classification Search
CPC ... G01R 31/318342; G01R 31/52; G06N 3/02
See application file for complete search history.

(56) References Cited

U.S. PATENT DOCUMENTS 6,153,115 A    11/2000  Le et al.
7,328,126 B2    2/2008  Chamness
(Continued)

FOREIGN PATENT DOCUMENTS

CN    103675637 B    3/2016
CN    106292631 A    1/2017
(Continued)

OTHER PUBLICATIONS

McMenemy, Donald et al., "A Machine Learning Approach for Adaptive Classification of Power MOSFET Failures", Aug. 30, 2019, 2019 IEEE Transporation Electriciation Conference and Expo (ITEC).*

(Continued)

Primary Examiner — Manuel L Barbee
(74) Attorney, Agent, or Firm — Dinsmore & Shohl, LLP (57) ABSTRACT

Systems and methods of testing the health of vehicular power devices are disclosed herein. A method may include producing operating points as a function of cycling current ($I_{ds}$) and voltage drain to source ($V_{ds}$) when a subject device is conducting current. The method may further include determining a mean of moving distribution to adapt a center of the moving distribution contrasted with a plurality of known healthy devices. The method may also include indicating an imminent fault in the subject device based upon a discontinuity among operating points above a threshold.

20 Claims, 11 Drawing Sheets

(56) References Cited

U.S. PATENT DOCUMENTS

| | | | |
|---|---|---|---|
| 7,734,451 B2 | 6/2010 | MacArthur et al. | |
| 2005/0060103 A1* | 3/2005 | Chamness | G05B 23/024 |
| | | | 702/30 |
| 2005/0149299 A1* | 7/2005 | Bolt | G05B 23/0254 |
| | | | 703/2 |
| 2010/0049680 A1 | 2/2010 | Huang et al. | |
| 2011/0190956 A1* | 8/2011 | Kunst | G06F 1/28 |
| | | | 700/292 |
| 2013/0257177 A1* | 10/2013 | Jacobson | H02M 1/08 |
| | | | 307/115 |
| 2015/0371134 A1 | 12/2015 | Chien et al. | |
| 2016/0163035 A1 | 6/2016 | Chang et al. | |

FOREIGN PATENT DOCUMENTS

| | | |
|---|---|---|
| CN | 104914851 B | 5/2017 |
| CN | 109116150 A | 2/2019 |
| CN | 107272654 B | 6/2019 |
| TW | I408387 B | 9/2013 |

OTHER PUBLICATIONS

Harrou, F., Ramahaleomiarantsoa, J. F., Nounou, M., & Nounou, H. (2016). A data-based technique for monitoring of wound rotor induction machines: A simulation study. Engineering Science and Technology, an International Journal, 19 (3), 1424-1435. https://www.sciencedirect.com/science/article/pii/S2215098615302020.

Xu, Lin & Cao, Maoyong & Song, Baoye & Zhang, Jiansheng & Liu, Yurong & Alsaadi, Fuad. (2018). Open-Circuit Fault Diagnosis of Power Rectifier using Sparse Autoencoder based Deep Neural Network. Neurocomputing. 10.1016/j.neucom.2018.05.040. https://www.researchgate.net/publication/325254691_Open-Circuit_Fault_Diagnosis_of_Power_Rectifier_using_Sparse_Autoencoder_based_Deep_Neural_Network.

\* cited by examiner

SYSTEMS AND METHODS FOR FALSE-POSITIVE REDUCTION IN POWER ELECTRONIC DEVICE EVALUATION

TECHNICAL FIELD

The present application generally relates to vehicular power devices and, more particularly, to testing the health of vehicular power electronic devices.

BACKGROUND

Statistical procedures may be used to predict or detect failure in power electronics devices, such as those used in electrified vehicles. For example, an orthogonal transformation may be used to convert a set of observations of potentially-correlated variables (entities each of which takes on various numerical values) into a set of values of linearly uncorrelated variables called principal components. A mean may be determined through training by monitoring device health, such that when a device exceeds the mean, a failure may be detected.

However, operating parameters of healthy devices may drift over time. For example, the on-resistance of a healthy device may decrease over several thousand on-off cycles. The drifting of the mean may cause faults to be falsely detected in otherwise healthy devices.

SUMMARY

In an aspect, a method may include producing operating points as a function of cycling current and voltage drain to source when a subject device is conducting current. The method may further include determining a mean of distributions through an exponentially weighted moving average to adapt a center of a moving distribution contrasted with a plurality of known healthy devices. The method may also include indicating an imminent fault in the subject device based upon a discontinuity among operating points.

In another aspect, a system may include non-transitory memory and a processor coupled to the non-transitory memory. The system may further include a measurement module configured to utilize the processor to produce operating points as a function of cycling current and voltage drain to source when a subject device is conducting current. The system may also include a determination module configured to determine a mean of distributions from the measurement module through an exponentially weighted moving average to adapt a center of a moving distribution contrasted with a plurality of known healthy devices. The system may additionally include an output module configured to indicate an imminent fault in the subject device based upon a discontinuity among operating points.

In yet another aspect, a system may include non-transitory memory and a processor coupled to the non-transitory memory. The system may further include a measurement module configured to utilize the processor to produce operating points as a function of cycling current ($I_{ds}$) and voltage drain to source (Vas) when a subject device is conducting current, wherein the operating points of the subject device are non-stationary. The system may also include a determination module configured to compute median values for each cycle when the subject device is powered on. The determination module may be further configured to remove the exponentially weighted moving average estimate of the mean of observed measurements. The determination module may also be configured to median-filter the computed median values. The determination module may be additionally configured to determine a mean of moving distribution through an exponentially weighted moving average to adapt a center of the moving distribution contrasted with a plurality of known healthy devices. The system may additionally include an output module configured to indicate an imminent fault in the subject device based upon a discontinuity among operating points above a threshold.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to testing the health of vehicular power electronic devices. For example, the on-resistance of a health device may be utilized to determine whether a device is likely to fail in the near future. However, a change in operating parameters may cause the on-resistance, but may not necessarily indicate that a device is or will imminently be failing. The operating parameters used to make that determination may shift over time, such that a measured change may be associated with healthy device behavior. For example, utilizing an exponentially weighted moving average, the device can be compared to the center of a moving distribution associated with known healthy devices. A device may be a vehicle power device, which may include a semiconductor switching device. Non-limiting examples may include insulated gate bipolar transistors, power transistors, bipolar mode static induction transistors, power MOSFETs, and the like.

Figure 1A:
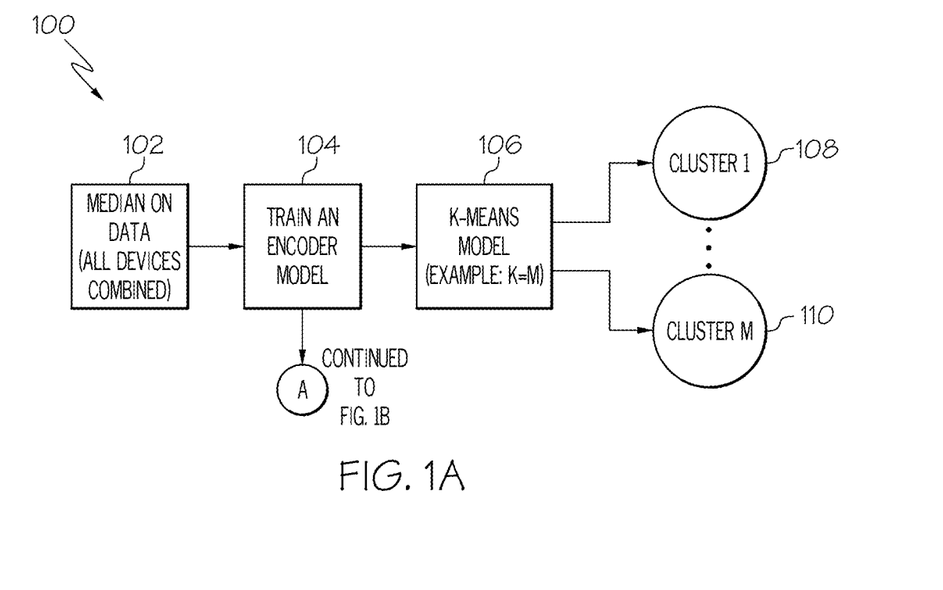
FIG. 1A is a block diagram illustrating an exemplary system for an auto encoder training phase, according one or more embodiments shown and described herein.

Turning to FIG. 1A, an autoencoder training phase 100 is depicted in an embodiment featuring an autoencoder (i.e., an unsupervised artificial neural network), which, as discussed further herein, utilizes an encoder and a decoder. Training median data 102 may feature the median "on data" pertaining to the behavior of devices being powered on within a data set of any suitable size. In one example, this may involve recording a median value for each of the dimensions associated with the device based upon measurements obtained from a plurality of times when the device is on. This may further involve receiving the median value for each of the dimensions to produce a two dimensional space, as discussed in more detail herein. The training median data 102 utilizes the median of all devices combined. Encoder model training 104, as discussed in more detail herein, is used to generate a model utilized in the device testing phase (proceeding to step A proceeding from 104 in FIG. 1A to 116 in FIG. 1B).

In this embodiment, the encoder maps data to a dimensionally-reduced space, while the decoder reproduces a representation of the original data obtained from the encoded, dimensionally-reduced space. Utilizing the trained encoder, a k-means model 106 is used to cluster the training data into a first cluster 108 and additional clusters 110, where the clustering, as discussed in more detail, is based upon observed encoded device features in the dimensionally-reduced training set. This may involve, for example, clustering training set features observed in the encoded features according to K-means clustering. In this way, the good behavior of devices can be modeled using the encoded space of an autoencoder by plotting the encoded features against one another and observing where the patterns of good behavior lie in the training phase.

Figure 1B:
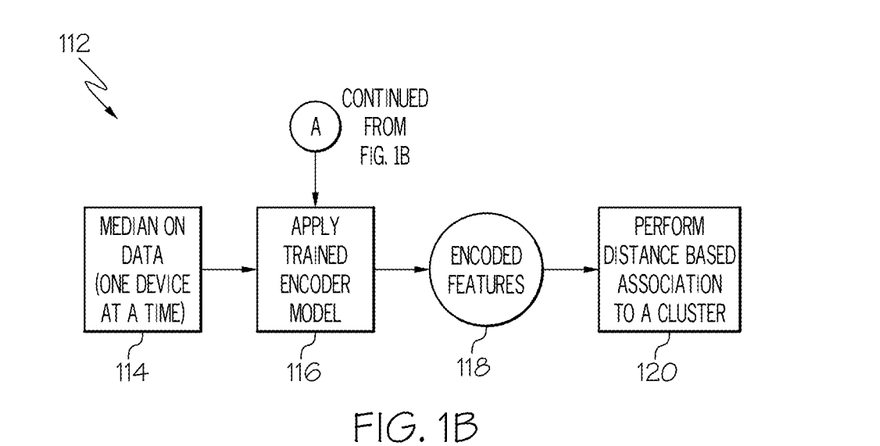
FIG. 1B is a block diagram illustrating an exemplary system for an auto encoder testing phase, according one or more embodiments shown and described herein.

Turning to FIG. 1B, an autoencoder testing phase 112 is depicted in an embodiment utilizing a trained model. In this embodiment, testing median on data 114 is received/input on a per-device basis, rather than combined as in the training phase 100. Once the training phase 100 is complete (see step A proceeding from 104 in FIG. 1A) and the model has been developed, the trained encoder model 116 is applied to the testing median on data 114. The trained encoder model 116 encodes the data into a dimensionally-reduced space based upon encoded features by applying the trained model 116 learned in a training phase 100 to encode features of the other devices and associate the features of the other devices. For example, if a device is represented by an input feature set of three or more dimensions, the encoder may be used to reduce the representation of each device within a two dimensional space based upon two preselected dimensions. Dimensions may be any suitable characteristics that can pertain to devices. Non-limiting examples of dimensions can include diode temperature, case to heat-sink temperature difference, voltage drain to source, current drain to source, voltage gate to source, power, and/or estimated thermal resistance. As discussed in more detail in FIGS. 2-3, distance-based cluster association 120 is performed utilizing the encoded features 118 as pertaining to the dimensionally-reduced representations of the devices within the testing median on data 114.

Figure 2:
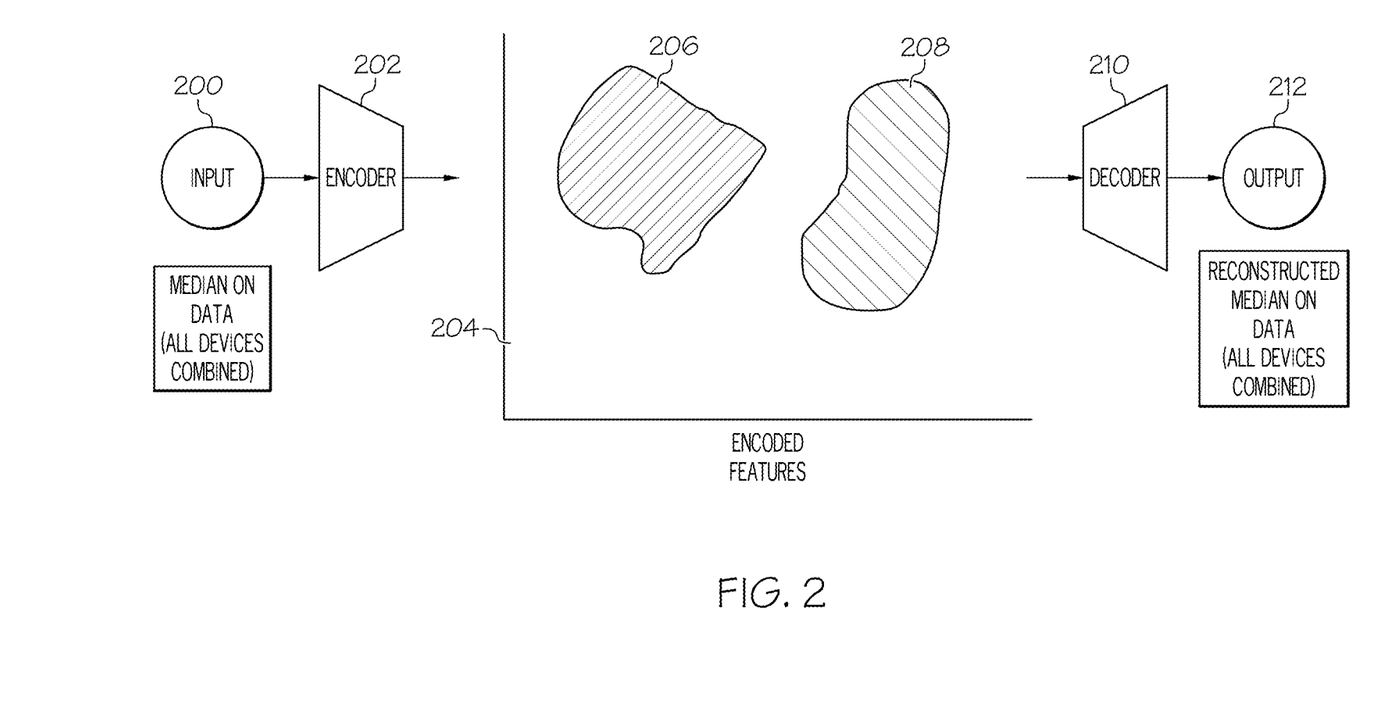
FIG. 2 is a diagram schematically illustrating an exemplary auto encoding process utilizing K-means to cluster the training set features observed in the encoded features, according one or more embodiments shown and described herein.

Turning to FIG. 2, an exemplary auto encoding process utilizes K-means to cluster the training set features observed in the encoded features. Median data pertaining to median on-state data of all devices combined serves as input 200 for an encoder as part of an autoencoder. Any suitable type of encoder may be utilized. Within the dimensionally-reduced encoded space 204, K-means clustering is utilized to place devices in the training phase into a first cluster 206 and a second cluster 208, although any suitable clustering or other organizational technique may be utilized. K-means clustering utilizes vector quantization, where, as discussed herein, each device is assigned a vector label. The vectors are grouped into clusters based upon their respective positions relative to the mean of each cluster (i.e., the cluster prototype value). As discussed herein, the cluster grouping may be based, for example, on determining a minimum Mahalanobis distance between the mean of each cluster and the location of the vector label, thus associating the device with the behavior of a cluster whose behavior most closely resembles that of the device. A Mahalanobis distance is a measurement of how many standard deviations away a particular point is from the mean of a cluster or other distribution.

A decoder 210 is utilized to output 212 the reconstructed median on data (of all devices combined) by mapping the clustered, dimensionally reduced representations back to a reconstruction of their original form. This preserves only relevant aspects of the input 200 in the output 212. Any suitable type of decoder 210 may be utilized to output 212 the reconstructed median on data (of all devices combined) that corresponds to the input 200.

Figure 3:
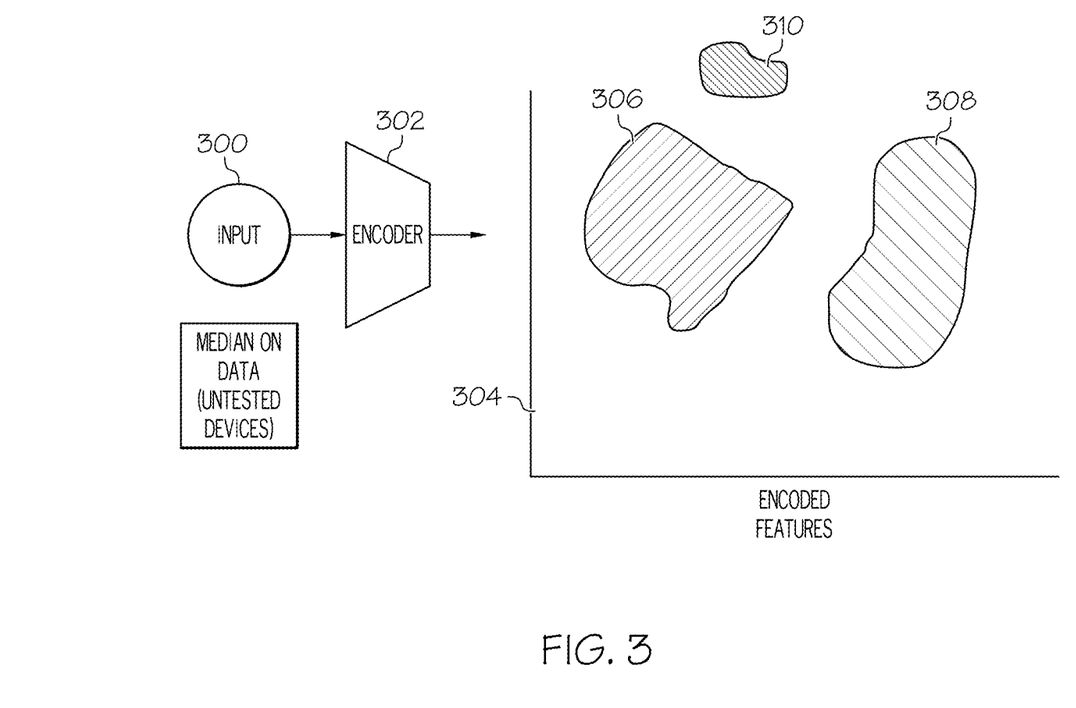
FIG. 3 is a diagram schematically illustrating an exemplary auto encoding process utilizing K-means to test new observed features in another device where the health is unknown, according one or more embodiments shown and described herein.

Turning to FIG. 3, an exemplary auto encoding process utilizes K-means to test new observed features in another device where the health is unknown. Input 300 in this embodiment pertains to untested devices whose median on data is input into the encoder 302 to produce a dimensionally-reduced encoded space 204 of two dimensions. Based upon the input 300, a first cluster 306, a second cluster 308, and a third cluster 310 are generated. For example, if the third cluster 310 is a "healthy cluster" (i.e., exhibits healthy behavior), then the Mahalanobis distance with respect to the third cluster 310 can serve as a threshold indicator of device failure if it deviates from all healthy clusters. Device failure can also be associated with adhering most closely to a "bad" cluster of devices experiencing or on the verge of failure.

Figure 4:
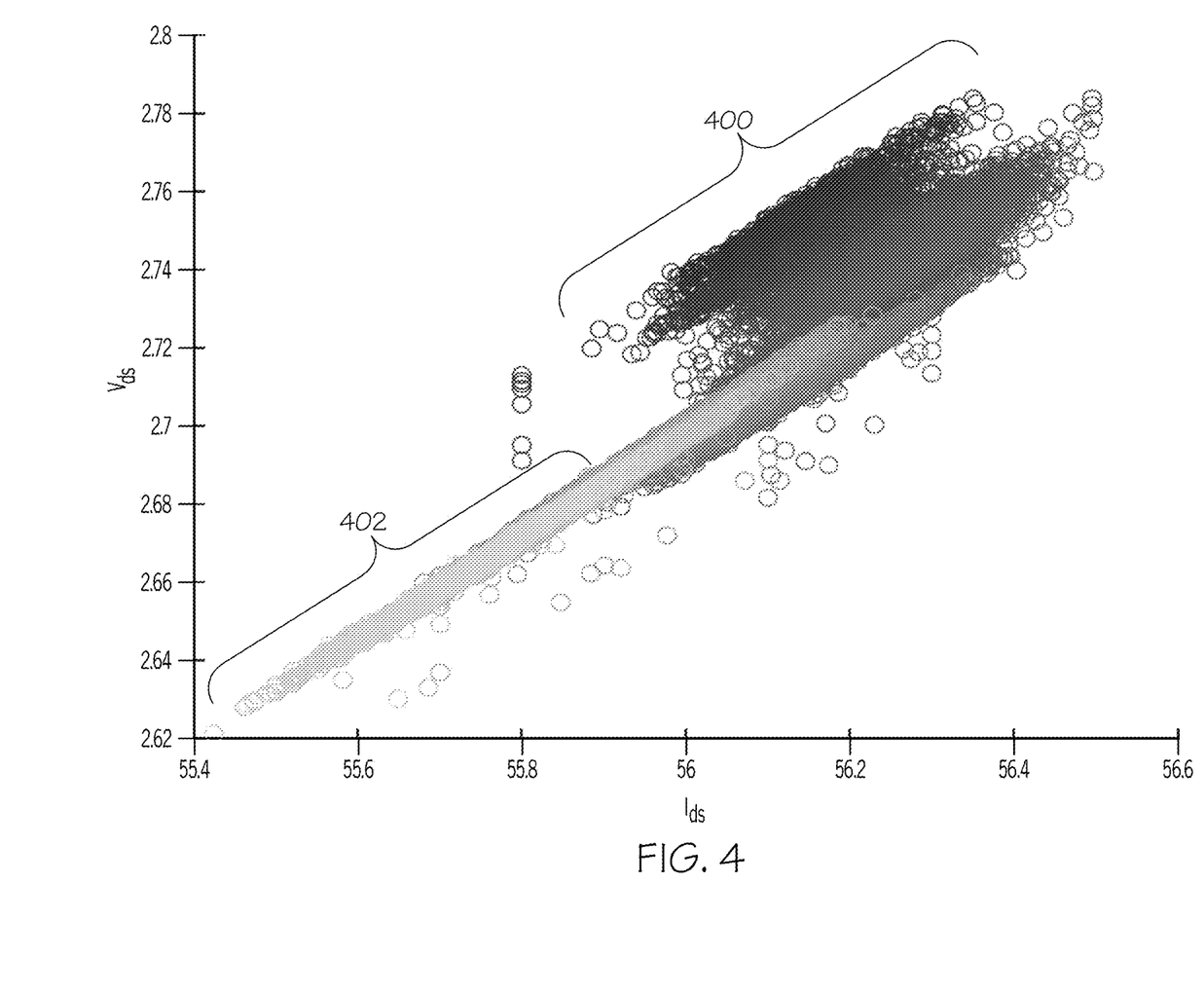
FIG. 4 is an exemplary graph illustrating observed operating points for a device as a function of cycling current and voltage drain to source when the device is conducting current, according one or more embodiments shown and described herein.

Turning to FIG. 4, an exemplary graph illustrates observed operating points for a device as a function of cycling current and voltage drain to source when the device is conducting current. The observed operating points for a device are represented as a function of cycling current ($I_{ds}$) and voltage drain to source ($V_{ds}$) when the device is conducting current (i.e., the "on state"). The darker data points (i.e., circles) correspond to the beginning of the time series 400, while the lighter data points represent the data from the end of the time series 402. As shown in FIG. 4, the device experiences an operating drift over time. However, this does not indicate an imminent device fault, which is observed when there are discontinuities in the features (given the devices have not been turned on). For example, the mean of the distributions is updated to account for the healthy operation of the observed measurements drifting under accelerated aging tests. In this embodiment, a continuous change in on-state resistance of the subject device is not indicative of a failure, whereas an imminent fault based upon discontinuities in features above a threshold before the subject device is powered on.

Figure 5:
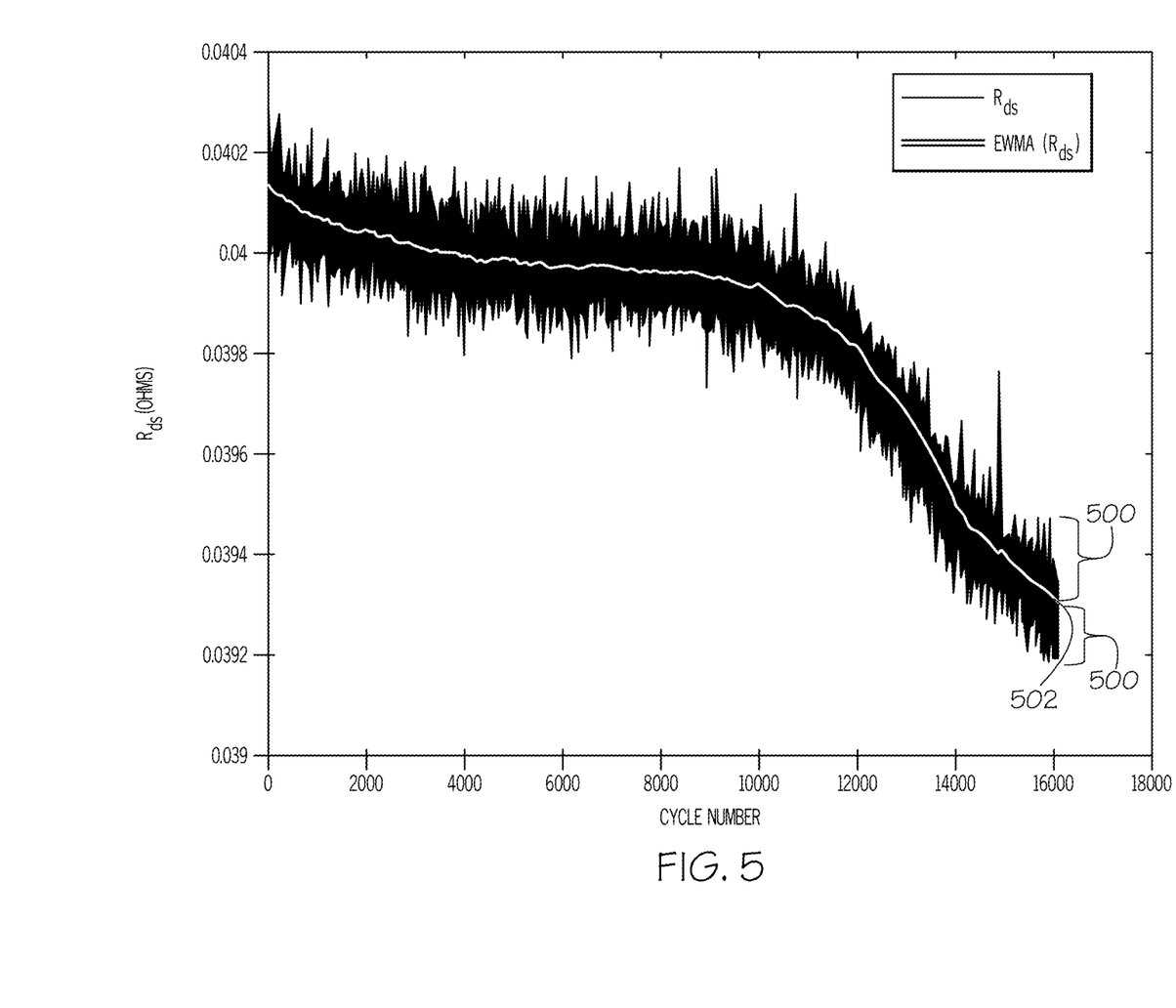
FIG. 5 is an exemplary graph illustrating on-state resistance of an example power electronics device and the exponentially weighted moving average of the resistance, according one or more embodiments shown and described herein.

Turning to FIG. 5, an exemplary graph illustrates on-state resistance ($R_{ds}$) 500 of an example power electronics device and the exponentially weighted moving average 502 of the resistance. The exponentially weighted moving average assigns greater weight to more recent data points and diminishes prior observations as they increase in age. The $R_{ds}$ 500 and the exponentially weighted moving average 502 are plotted over thousands of power cycles, where there is a noticeable decline in $R_{ds}$ 500 and the exponentially weighted moving average 502. However, this continuous change in $R_{ds}$ 500 is not indicative of a failure, as the device's operation point is non-stationary. As discussed previously with respect to FIGS. 2-3, healthy device behavior can be modeled to account for non-stationary (i.e., drifting) behavior. By contrast, disjointed data points that fall outside of the general drift could be indicative of imminent device failure.

Figure 6A:
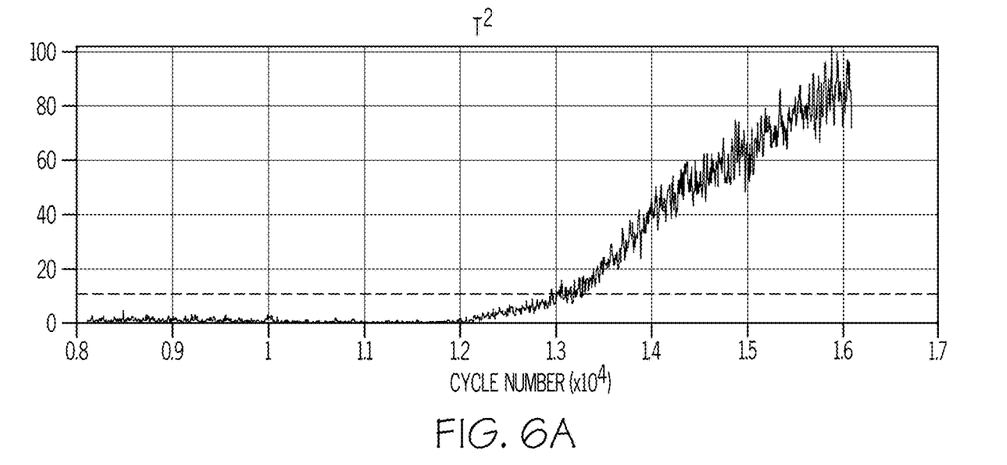
FIG. 6A is an exemplary graph illustrating the principal component analysis of the on-state resistance of an exemplary power electronics device in $T^2$ statistics, according one or more embodiments shown and described herein.

Turning to FIG. 6A, an exemplary graph in $T^2$ statistics illustrates the principal component analysis of $R_{ds}$ of an exemplary power electronics device. In contrast to the exponentially weighted moving average, more training data is used here with principal component analysis for the training phase of the artificial neural network.

Figure 6B:
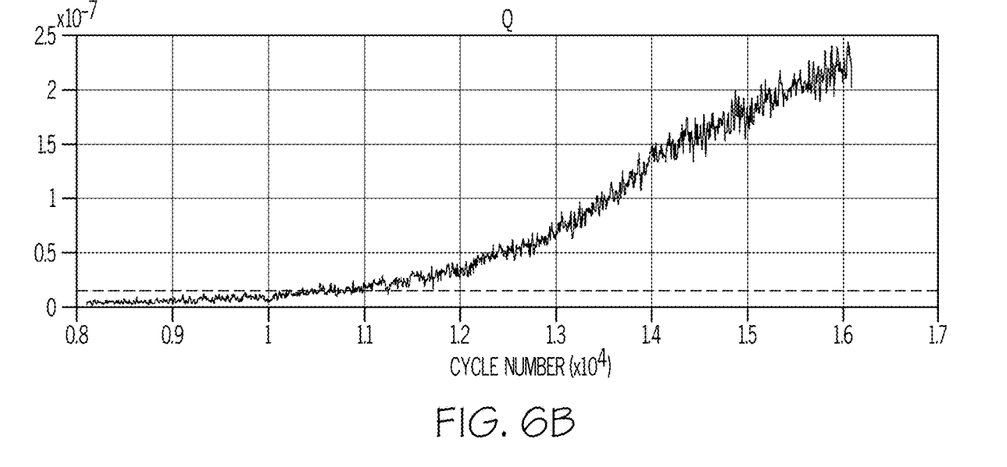
FIG. 6B is an exemplary graph illustrating the principal component analysis of the on-state resistance of an exemplary power electronics device in Q statistics, according one or more embodiments shown and described herein.

Turning to FIG. 6B, an exemplary graph in Q statistics illustrates the principal component analysis of $R_{ds}$ of an exemplary power electronics device. In contrast to the exponentially weighted moving average, more training data is used here with principal component analysis for the training phase of the artificial neural network.

Figure 7A:
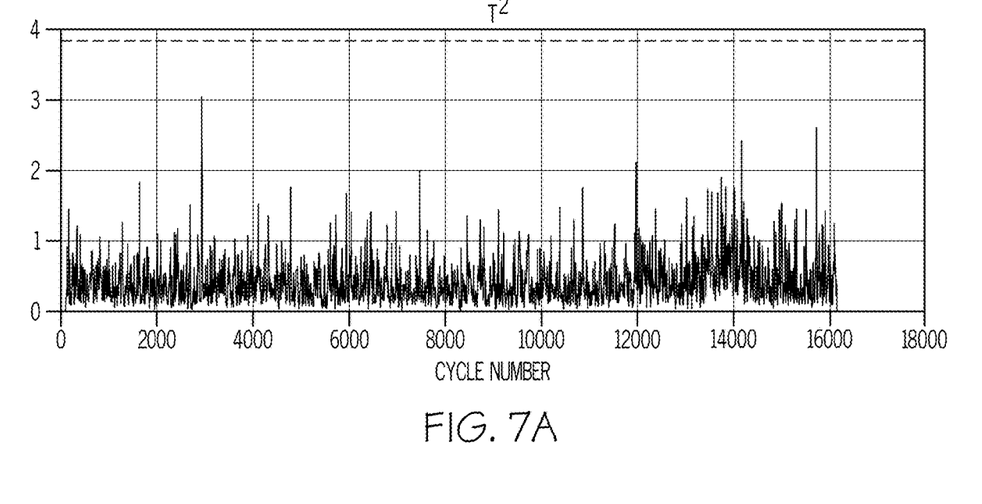
FIG. 7A is an exemplary graph illustrating the exponentially weighted moving average of the on-state resistance of an exemplary power electronics device in $T^2$ statistics, according one or more embodiments shown and described herein.

Turning to FIG. 7A, an exemplary graph in $T^2$ statistics illustrates the exponentially weighted moving average of $R_{ds}$ of an exemplary power electronics device. In contrast to the $T^2$ statistics illustration of FIG. 6A, less training data is used here for the training phase of the artificial neural network by utilizing the exponentially weighted moving average.

Figure 7B:
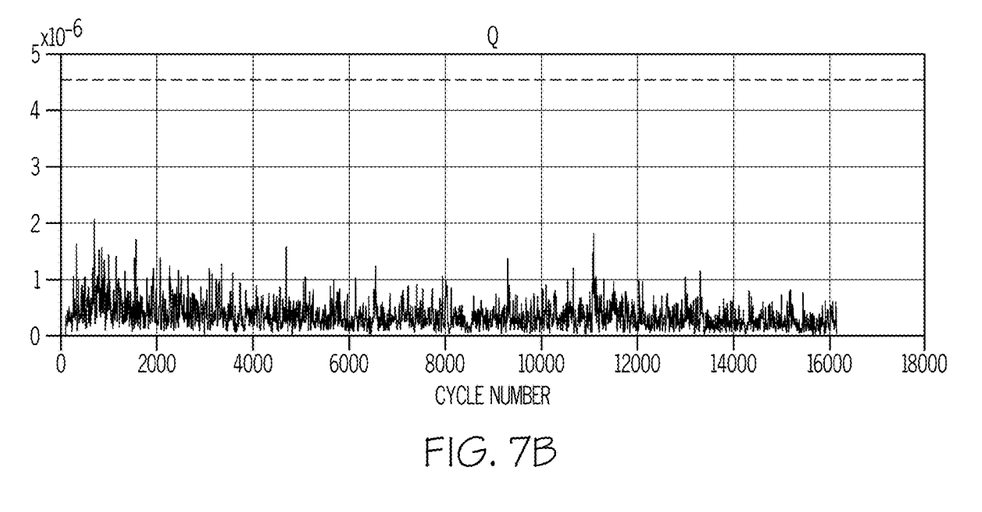
FIG. 7B is an exemplary graph illustrating the exponentially weighted moving average of the on-state resistance of an exemplary power electronics device in Q statistics, according one or more embodiments shown and described herein.

Turning to FIG. 7B, an exemplary graph in Q statistics illustrates the exponentially weighted moving average of $R_{ds}$ of an exemplary power electronics device. In contrast to the Q statistics illustration of FIG. 6B, less training data is used here for the training phase of the artificial neural network by utilizing the exponentially weighted moving average.

Figure 8:
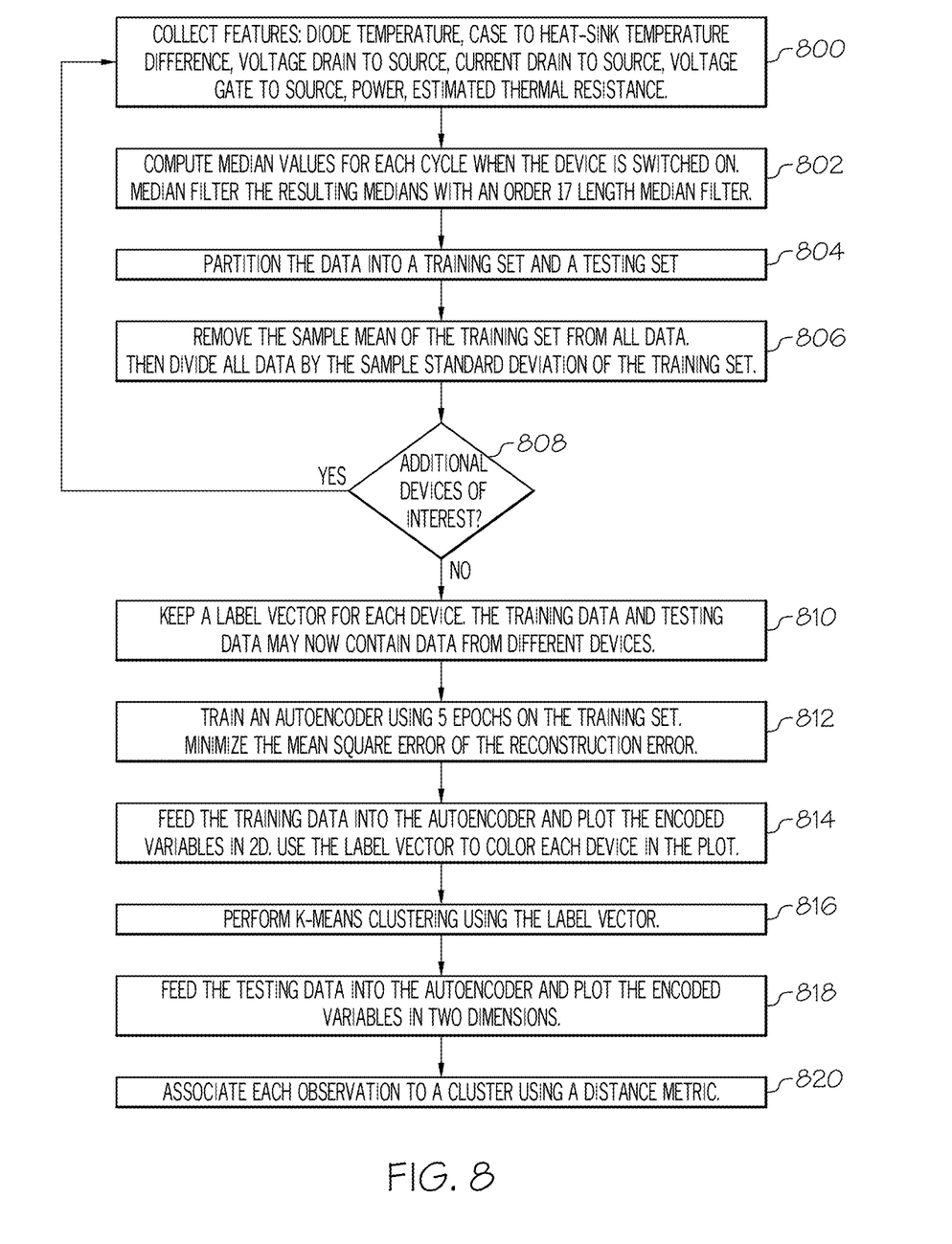
FIG. 8 illustrates a flowchart for visual clustering for outlier detection, according to one or more embodiments described and illustrated herein.

Turning to FIG. 8, a flowchart depicts an exemplary process of visual clustering for outlier detection. At block 800, device features may be collected. Features of devices, by way of non-limiting example, may include one or more of diode temperature, case to heat-sink temperature difference, voltage drain to source, current drain to source, voltage gate to source, power, and/or estimated thermal resistance. Collection of these features may be performed, for example, by electrical current injection and/or measurement devices, devices that measure electrical resistance such as ohmmeters and multimeters, and thermal sensors such as diode temperature sensors. In other embodiments, any other suitable device features may be utilized. At block 802, median values are computed for each cycle when the device is switched on. In some embodiments, a device may subject to any suitable number of cycles, which may include accelerated aging to simulate device degradation over time. Thus, the mean of the moving distribution can be updated to account for observed measurements drifting under accelerated aging tests within healthy operation. A median-filter may be performed upon the resulting medians. In this example, this is with an order 17 length median-filter, although any suitable order length median-filter may be utilized.

At block 804, the data is partitioned into a training set and a testing set. Specifically, some of the data regarding the computed median values for each device cycle can be used as a training set so that the model learns healthy device behavior, including any drift in operating points over time. Other portions of the computed median values data can be used in the testing phase to determine whether a given device is exhibiting healthy device behavior. The data used for testing is not used to modify the trained model. A sample mean is also applied to the training set as an estimator for the population mean of the training set. At block 806, the sample mean of the training set is removed. All of the data is then divided by the sample standard deviation of the training set.

At block 808, a determination is made as to whether there are additional devices of interest beyond the current device being tested. Additional devices, which may be other power devices similar to the current device of interest, may be in the testing dataset, such that the determination hinges upon whether there are any additional devices remaining in the testing dataset. If additional devices of interest are available, then the process returns to block 800. Otherwise, if no additional devices of interest are available, then at block 810, a label vector for may be kept or applied to each device within the training data and/or testing data. The training data and testing data may now contain data from respectively different devices. At block 812, an autoencoder may be trained using, for example, 5 epochs on the training set. An epoch may relate in this example to intervals of power-cycling the device. Any suitable number of epochs may be utilized. During reconstruction of the training data within a reduced-dimensionality data set, the mean square error of the reconstruction error is minimized. The mean square error estimates the unobserved quantity of the training data, for example, and measures the average squared difference between the estimated and actual values.

At block 814, the training data is provided as input into the encoder portion of the autoencoder for dimensionality reduction. Specifically, the training data is encoded utilizing variables in two dimensions. For example, the training data may be represented by four dimensions, and is then encoded to be reduced to two dimensions. Dimensionality reduction may be accomplished by any suitable technique, such as feature selection or feature projection (e.g., principle component analysis, kernel principle component analysis, nonnegative matrix factorization, graph-based kernel principle component analysis, linear discriminant analysis, generalized discriminant analysis, and the like). The label vector that represents a given device may be plotted in the reduced two dimensional space. In this example, the label vectors may be represented by a color applied each device plotted in the two dimensional space. At block 816, k-means clustering is performed using the label vectors representing individual devices in the training data. As discussed with respect to FIGS. 2-3, the device clusters are color-coded to make them distinct. At block 818, once the training of the autoencoder is complete and a model has been generated, the testing data is fed into the autoencoder as input. Similar to the training data, the encoded variables are plotted in two dimensions with respect to each device in the testing phase. At block 820, each observation is associated with a cluster using a distance metric, such as the Mahalanobis distance between a label vector representing a device and the mean (or other representation) of a cluster (or other distribution).

Figure 9:
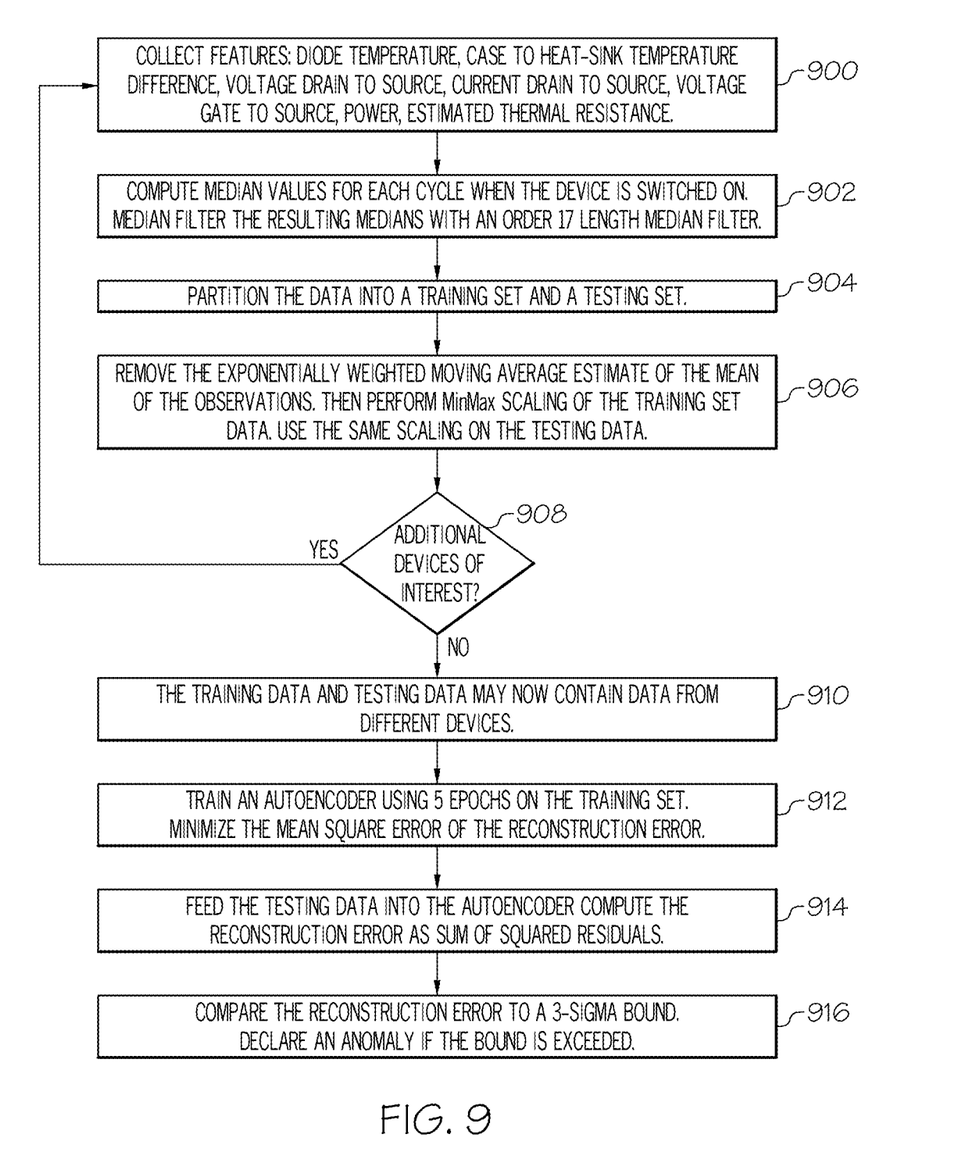
FIG. 9 illustrates a flowchart for an exponentially weighted moving average autoencoder for anomaly detection, according to one or more embodiments described and illustrated herein.

Turning to FIG. 9, a flowchart depicts an exemplary process of anomaly detection utilizing an exponentially weighted moving average autoencoder. At block 900, device features may be collected. Features of devices, by way of non-limiting example, may include one or more of diode temperature, case to heat-sink temperature difference, voltage drain to source, current drain to source, voltage gate to source, power, and/or estimated thermal resistance. Collection of these features may be performed, for example, by electrical current injection and/or measurement devices, devices that measure electrical resistance such as ohmmeters and multimeters, and thermal sensors such as diode temperature sensors. In other embodiments, any other suitable device features may be utilized. At block 902, median values are computed for each cycle when the device is switched on. In some embodiments, a device may be subjected to any suitable number of cycles, which may include accelerated aging to simulate device degradation over time. A median-filter may be performed upon the resulting medians. In this example, this is with an order 17 length median-filter, although any suitable order length median-filter may be utilized.

At block 904, the data is partitioned into a training set and a testing set. Specifically, some of the data regarding the computed median values for each device cycle can be used as a training set so that the model learns healthy device behavior, including any drift in operating points over time. Other portions of the computed median values data can be used in the testing phase to determine whether a given device is exhibiting healthy device behavior. The data used for testing is not used to modify the trained model. A sample mean is also applied to the training set as an estimator for the population mean of the training set. At block 906, exponentially weighted moving average estimate of the mean of the observations is removed. Specifically, the exponentially weighted moving average estimate of the mean pertains to an estimate of how the movement of behavior of devices was initially predicted to behave. Once the exponentially weighted moving average estimate of the mean has been removed, then MinMax scaling is performed of the training set data. MinMax rescaling is a type of feature scaling that rescales a range of features to scale the range (such as [0, 1] or [−1, 1]). The target range selected may depend on the nature of the data.

At block 908, a determination is made as to whether there are additional devices of interest. Additional devices, which may be other power devices similar to the current device of interest, may be in the testing dataset, such that the determination hinges upon whether there are any additional devices remaining in the testing dataset. If additional devices of interest are available, then the process returns to block 800. Otherwise, if no additional devices of interest are available, then at block 910, the training data and testing data may contain data from respectively different devices, and may be mutually exclusive.

At block 912, an autoencoder may be trained using, for example, 5 epochs on the training set. An epoch may relate in this example to intervals of power-cycling the device. Any suitable number of epochs may be utilized. During reconstruction of the training data within a reduced-dimensionality data set, the mean square error of the reconstruction error is minimized. At block 914, the testing data is input into the autoencoder, where the reconstruction error is computed the as sum of squared residuals (i.e., the sum of squared estimate of errors) is a measure of discrepancy between the predicted model used in the autoencoder versus the actual measurements. Determining this difference helps the neural network refine its model as it reduces the discrepancy over iterations. At block 916, compare the reconstruction error to a 3-sigma bound (i.e., a calculation that refers to data within three standard deviations from a mean). An anomaly for a device is identified/declared if the 3-sigma bound (e.g., a threshold) is exceeded.

Figure 10:
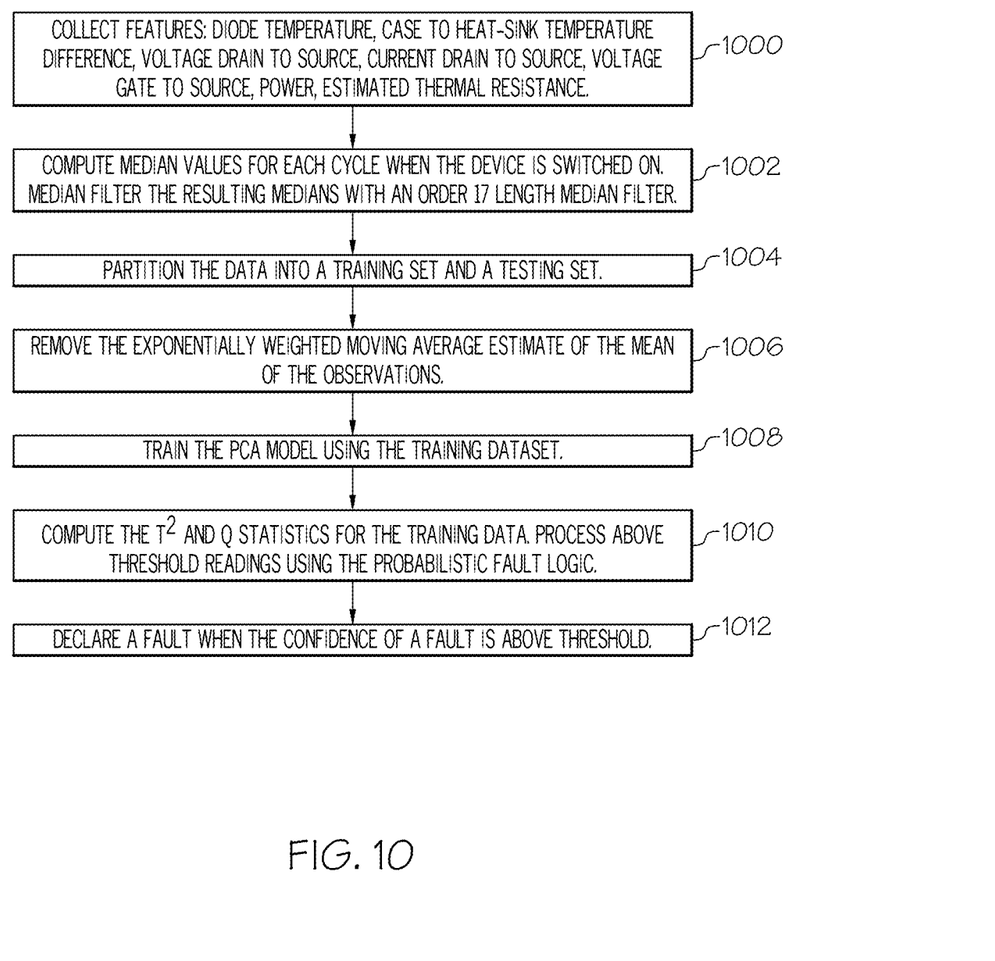
FIG. 10 illustrates a flowchart for exponentially weighted moving average principal component analysis for anomaly detection, according to one or more embodiments described and illustrated herein.

Turning to FIG. 10, a flowchart depicts an exemplary process of anomaly detection utilizing exponentially weighted moving average principal component analysis. At block 1000, device features may be collected. Features of devices, by way of non-limiting example, may include one or more of diode temperature, case to heat-sink temperature difference, voltage drain to source, current drain to source, voltage gate to source, power, and/or estimated thermal resistance. Collection of these features may be performed, for example, by electrical current injection and/or measurement devices, devices that measure electrical resistance such as ohmmeters and multimeters, and thermal sensors such as diode temperature sensors. In other embodiments, any other suitable device features may be utilized. At block 1002, median values are computed for each cycle when the device is switched on. In some embodiments, a device may subject to any suitable number of cycles, which may include accelerated aging to simulate device degradation over time. A median-filter may be performed upon the resulting medians. In this example, this is with an order 17 length median-filter, although any suitable order length median-filter may be utilized.

At block 1004, the data is partitioned into a training set and a testing set. Specifically, some of the data regarding the computed median values for each device cycle can be used as a training set so that the model learns healthy device behavior, including any drift in operating points over time. Other portions of the computed median values data can be used in the testing phase to determine whether a given device is exhibiting healthy device behavior. The data used for testing is not used to modify the trained model. A sample mean is also applied to the training set as an estimator for the population mean of the training set. At block 1006, exponentially weighted moving average estimate of the mean of the observations is removed. Specifically, the exponentially weighted moving average estimate of the mean pertains to an estimate of how the movement of behavior of devices was initially predicted to behave.

At block 1008, principal component analysis model is trained using the training dataset. Principal component analysis utilizes an orthogonal transformation to convert a set of observations about a set of variables whose relations are unknown into a set of values of linearly-uncorrelated variables (principal components). In this embodiment, principal component analysis models the moving distribution and forms the moving distribution from a portion of data observed during a time period when the subject device was in a healthy condition. At block 1010, $T^2$ and Q statistics are computed for the training data. As discussed previously, FIGS. 6A and 6B respectively illustrate training data in $T^2$ and Q statistics obtained by performing principal component analysis of $R_{ds}$ in power electronics devices. Devices having reading above a threshold, using the probabilistic fault logic (such as fault tree analysis), are identified. At block 1012, a device fault is declared when the confidence of a fault is above a specified threshold.

Figure 11:
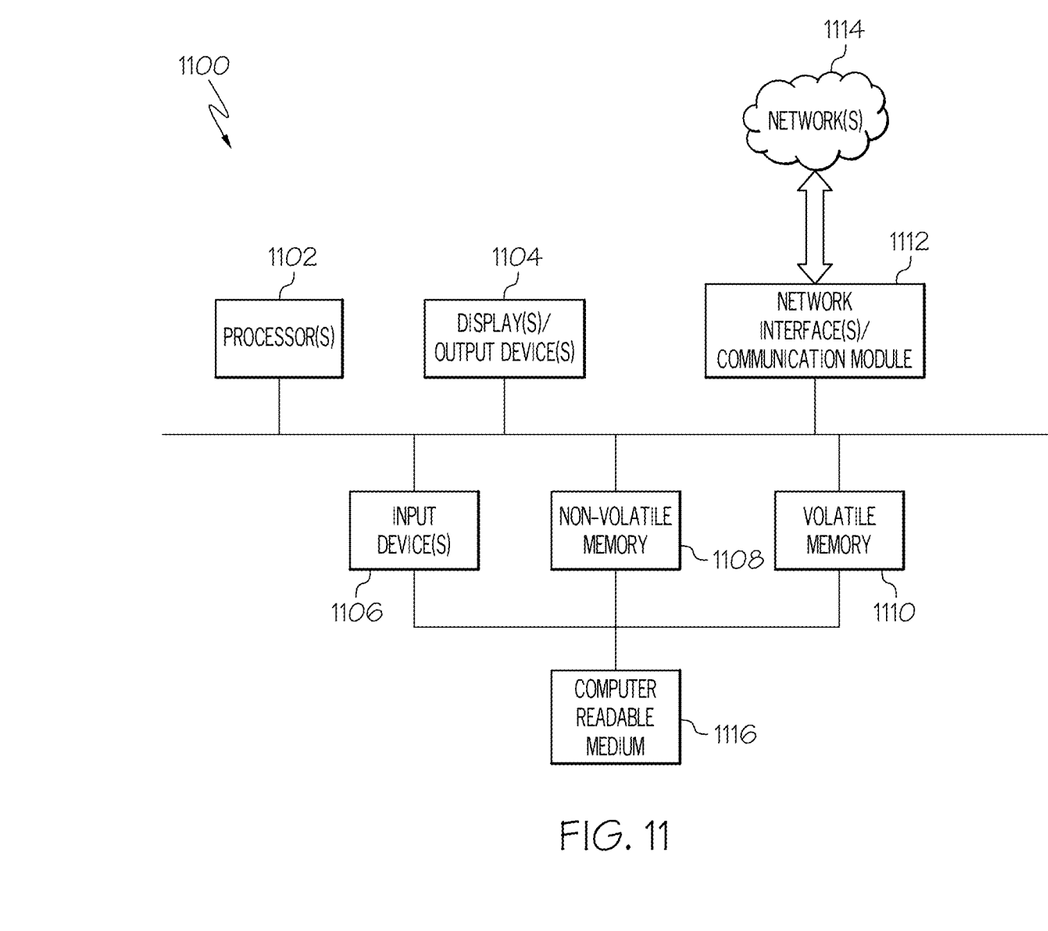
FIG. 11 is a block diagram illustrating computing hardware utilized in one or more devices for implementing various systems and processes, according one or more embodiments shown and described herein.

Turning to FIG. 11, a block diagram illustrates an exemplary computing environment 1100 through which embodiments of the disclosure can be implemented, such as, for example, in the encoders 202, 302 and/or decoder 210 as depicted in FIGS. 2-3 and/or any subcomponents therein, along with any other computing device depicted in any of FIGS. 1-10. The exemplary computing environment 1100 may include non-volatile memory 1108 (ROM, flash memory, etc.), volatile memory 1110 (RAM, etc.), or a combination thereof. In some embodiments, the at least one processor 1102 is coupled to non-transitory memory such as the non-volatile memory 1108 and/or volatile memory 1110. The exemplary computing environment 1100 may utilize, by way of non-limiting example, RAM, ROM, cache, fiber optics, EPROM/Flash memory, CD/DVD/BD-ROM, hard disk drives, solid-state storage, optical or magnetic storage devices, diskettes, electrical connections having a wire, any system or device that is of a magnetic, optical, semiconductor, or electronic type, or any combination thereof.

The exemplary computing environment 1100 can include one or more displays and/or output devices 1104 such as monitors, speakers, headphones, projectors, wearable-displays, holographic displays, and/or printers, for example. The exemplary computing environment 1100 may further include one or more input devices 1106 which can include, by way of example, any type of mouse, keyboard, disk/media drive, memory stick/thumb-drive, memory card, pen, joystick, gamepad, touch-input device, biometric scanner, voice/auditory input device, motion-detector, camera, scale, etc.

A network interface 1112 can facilitate communications over one or more networks 1114 via wires, via a wide area network, via a local area network, via a personal area network, via a cellular network, via a satellite network, etc. Suitable local area networks may include wired Ethernet and/or wireless technologies such as, for example, wireless fidelity (Wi-Fi). Suitable personal area networks may include wireless technologies such as, for example, IrDA, Bluetooth, Wireless USB, Z-Wave, ZigBee, and/or other near field communication protocols. Suitable personal area networks may similarly include wired computer buses such as, for example, USB and FireWire. Suitable cellular networks include, but are not limited to, technologies such as LTE, WiMAX, UMTS, CDMA, and GSM. The exemplary computing environment 1100 may include one or more network interfaces 1112 to facilitate communication with one or more remote devices, which may include, for example, client and/or server devices. A network interface 1112 may also be described as a communications module, as these terms may be used interchangeably. Network interface 1112 can be communicatively coupled to any device capable of transmitting and/or receiving data via the one or more networks 1114, which may correspond to any computing device depicted in any of FIGS. 1-10, by way of non-limiting example.

The network interface hardware 1112 can include a communication transceiver for sending and/or receiving any wired or wireless communication. For example, the network interface hardware 1112 may include an antenna, a modem, LAN port, Wi-Fi card, WiMax card, mobile communications hardware, near-field communication hardware, satellite communication hardware and/or any wired or wireless hardware for communicating with other networks and/or devices.

A computer-readable medium 1116 may comprise a plurality of computer readable mediums, each of which may be either a computer readable storage medium or a computer readable signal medium. A computer readable medium 1116 may reside, for example, within an input device 1106, non-volatile memory 1108, volatile memory 1110, or any combination thereof. A computer readable storage medium can include tangible media that is able to store instructions associated with, or used by, a device or system. A computer readable storage medium includes, by way of non-limiting examples: RAM, ROM, cache, fiber optics, EPROM/Flash memory, CD/DVD/BD-ROM, hard disk drives, solid-state storage, optical or magnetic storage devices, diskettes, electrical connections having a wire, or any combination thereof. A computer readable storage medium may also include, for example, a system or device that is of a magnetic, optical, semiconductor, or electronic type. Computer readable storage media exclude propagated signals and carrier waves.

It should now be understood that a continuous change in the resistance of a device is not necessarily indicative of device failure. Specifically, the device's operating point may not be non-stationary. By accounting for the changing mean in the operating points of healthy devices, more false-positives can be avoided. Thus, one advantage of utilizing an exponentially weighted moving average is that it reduces false alarms due to the normal drift of the operating point associated with the device. Another advantage is that the training phase of an auto-encoder, utilized to help recognize the drift of healthy devices, can be completed with significantly less training data, thus providing for a more efficient analysis of the health of numerous devices.

Based upon the foregoing, it should be understood that utilizing an exponentially weighted moving average so that vehicle power devices can be compared to the center of a moving distribution associated with known healthy devices is not directed towards an abstract idea. In particular, the foregoing more accurately tracks the shift in healthy device characteristics over time, such that a measured change may be still be associated with healthy device behavior. Further, the subject matter herein improves the reliability of power devices in vehicles by providing more accurate testing.

It is noted that recitations herein of a component of the present disclosure being "configured" or "programmed" in a particular way, to embody a particular property, or to function in a particular manner, are structural recitations, as opposed to recitations of intended use. More specifically, the references herein to the manner in which a component is "configured" or "programmed" denotes an existing physical condition of the component and, as such, is to be taken as a definite recitation of the structural characteristics of the component.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the disclosure.

It is noted that the terms "substantially" and "about" and "approximately" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method comprising:
producing operating points as a function of cycling current ($I_{ds}$) and voltage drain to source ($V_{ds}$) when a subject device is conducting current;
determining a mean of moving distribution to adapt a center of the moving distribution contrasted with a plurality of known healthy devices; and
indicating an imminent fault in the subject device based upon a discontinuity among operating points above a threshold.

2. The method of claim 1 further comprising determining a mean of the moving distribution through an exponentially weighted moving average.

3. The method of claim 1 further comprising:
modelling the moving distribution via a principal component analysis process; and
forming the moving distribution from a portion of data observed during a time period when the subject device was in a healthy condition.

4. The method of claim 1 further comprising updating the mean of the moving distribution to account for observed measurements drifting under accelerated aging tests within healthy operation.

5. The method of claim 1 further comprising determining an imminent fault based upon discontinuities in features above a threshold before the subject device is powered on.

6. The method of claim 1 further comprising computing median values for each cycle when the subject device is powered on.

7. The method of claim 6 further comprising removing an exponentially weighted moving average estimate of the mean of observed measurements.

8. The method of claim 6 further comprising median-filtering the computed median values.

9. The method of claim 8 wherein a continuous change in on-state resistance of the subject device is not indicative of a failure.

10. The method of claim 1 wherein the operating points of the subject device are non-stationary.

11. A system comprising:
non-transitory memory and a processor coupled to the non-transitory memory;
a measurement device configured to utilize the processor to produce operating points as a function of cycling current ($I_{ds}$) and voltage drain to source ($V_{ds}$) when a subject device is conducting current;
a determination module configured to determine a mean of moving distribution to adapt a center of the moving distribution contrasted with a plurality of known healthy devices; and
an output device configured to indicate an imminent fault in the subject device based upon a discontinuity among operating points above a threshold.

12. The system of claim 11 wherein the determination module is further configured to determine the mean of the moving distribution through an exponentially weighted moving average.

13. The system of claim 11 wherein the determination module is further configured to:
model the moving distribution by principal component analysis; and
form the moving distribution from a portion of data observed during a time period when the device was in a healthy condition.

14. The system of claim 11 wherein the determination module is further configured to update the mean of the moving distribution to account for observed measurements drifting under accelerated aging tests within healthy operation.

15. The system of claim 11 wherein the determination module is further configured to determine an imminent fault based upon discontinuities in features above a threshold before the subject device is powered on.

16. The system of claim 11 wherein the determination module is further configured to compute median values for each cycle when the subject device is powered on.

17. The system of claim 16 wherein the determination module is further configured to remove the exponentially weighted moving average estimate of the mean of observed measurements.

18. The system of claim 16 wherein the determination module is further configured to median-filter the computed median values.

19. The system of claim 11 wherein:
the operating points of the subject device are non-stationary; and
a continuous change in on-state resistance of the subject device is not indicative of a failure.

20. A system comprising:
non-transitory memory and a processor coupled to the non-transitory memory;
a measurement device configured to utilize the processor to produce operating points as a function of cycling current ($I_{ds}$) and voltage drain to source ($V_{ds}$) when a subject device is conducting current, wherein the operating points of the subject device are non-stationary;
a determination module configured to:
compute median values for each cycle when the subject device is powered on;
remove the exponentially weighted moving average estimate of the mean of observed measurements;
median-filter the computed median values; and
determine a mean of moving distribution through an exponentially weighted moving average to adapt a center of the moving distribution contrasted with a plurality of known healthy devices; and an output device configured to indicate an imminent fault in the subject device based upon a discontinuity among operating points above a threshold.

\* \* \* \* \*

UNITED STATES PATENT AND TRADEMARK OFFICE
CERTIFICATE OF CORRECTION

PATENT NO. : 11,293,981 B2
APPLICATION NO. : 16/743541
DATED : April 5, 2022
INVENTOR(S) : McMenemy et al.

It is certified that error appears in the above-identified patent and that said Letters Patent is hereby corrected as shown below:

In the Specification

In Column 1, Line(s) 59, delete "Vas" and insert --$V_{ds}$--, therefor.

In the Claims

In Column 11, Line(s) 36, Claim 2, after "claim 1", insert --,--.

In Column 11, Line(s) 39, Claim 3, after "claim 1", insert --,--.

In Column 11, Line(s) 45, Claim 4, after "claim 1", insert --,--.

In Column 11, Line(s) 49, Claim 5, after "claim 1", insert --,--.

In Column 11, Line(s) 52, Claim 6, after "claim 1", insert --,--.

In Column 11, Line(s) 55, Claim 7, after "claim 6", insert --,--.

In Column 11, Line(s) 58, Claim 8, after "claim 6", insert --,--.

In Column 11, Line(s) 60, Claim 9, after "claim 8", insert --,--.

In Column 11, Line(s) 63, Claim 10, after "claim 1", insert --,--.

In Column 12, Line(s) 13, Claim 12, after "claim 11", insert --,--.

In Column 12, Line(s) 17, Claim 13, after "claim 11", insert --,--.

In Column 12, Line(s) 24, Claim 14, after "claim 11", insert --,--.

Signed and Sealed this
Twenty-fourth Day of May, 2022

Katherine Kelly Vidal
*Director of the United States Patent and Trademark Office*

CERTIFICATE OF CORRECTION (continued)
U.S. Pat. No. 11,293,981 B2

In Column 12, Line(s) 29, Claim 15, after "claim 11", insert --,--.

In Column 12, Line(s) 34, Claim 16, after "claim 11", insert --,--.

In Column 12, Line(s) 37, Claim 17, after "claim 16", insert --,--.

In Column 12, Line(s) 41, Claim 18, after "claim 16", insert --,--.

In Column 12, Line(s) 44, Claim 19, after "claim 11", insert --,--.